United States Patent
Lai

(10) Patent No.: US 7,825,662 B2
(45) Date of Patent: Nov. 2, 2010

(54) MRI APPARATUS AND CONTROL METHOD OF STEADY-STATE FREE PRECESSION (SSFP) WITH PHASE CYCLING, COMBINING LOW AND HIGH FREQUENCY IMAGES MULTIPLIED BY A SCALING FACTOR

(75) Inventor: Yongchuan Lai, Beijing (CN)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 288 days.

(21) Appl. No.: 12/062,388

(22) Filed: Apr. 3, 2008

(65) Prior Publication Data

US 2008/0246474 A1 Oct. 9, 2008

(30) Foreign Application Priority Data

Apr. 6, 2007 (CN) .......................... 200710137976

(51) Int. Cl.
*G01V 3/00* (2006.01)

(52) U.S. Cl. .................. 324/309; 324/307; 324/318

(58) Field of Classification Search ......... 324/300–322; 600/407–435; 382/128–131
See application file for complete search history.

(56) References Cited

U.S. PATENT DOCUMENTS

| | | | |
|---|---|---|---|
| 4,656,424 A | 4/1987 | Tsur et al. | |
| 4,973,906 A | 11/1990 | Bernstein | |
| 5,034,692 A | 7/1991 | Laub et al. | |
| 5,170,122 A | 12/1992 | Bernstein | |
| 5,256,967 A | 10/1993 | Foo et al. | |
| 5,291,891 A | 3/1994 | Foo et al. | |
| 5,347,216 A | 9/1994 | Foo | |
| 6,307,368 B1 | 10/2001 | Vasanawala et al. | |
| 6,556,856 B1 * | 4/2003 | Mistretta et al. | 600/420 |
| 6,624,630 B1 * | 9/2003 | Foxall | 324/307 |
| 6,819,104 B2 | 11/2004 | Yamazaki et al. | |
| 6,906,516 B2 | 6/2005 | Bangerter et al. | |
| 7,167,003 B2 * | 1/2007 | Eberhardt et al. | 324/318 |
| 7,327,139 B2 | 2/2008 | Ikezaki | |
| 7,429,862 B2 * | 9/2008 | Kholmovski et al. | 324/310 |
| 7,689,262 B2 * | 3/2010 | Kruger et al. | 600/410 |
| 2003/0214293 A1 | 11/2003 | Dixon et al. | |
| 2005/0033156 A1 * | 2/2005 | Kruger et al. | 600/410 |
| 2006/0043971 A1 * | 3/2006 | Eberhardt et al. | 324/307 |
| 2006/0088083 A1 | 4/2006 | Ikezaki | |
| 2007/0110290 A1 * | 5/2007 | Chang et al. | 382/128 |

(Continued)

*Primary Examiner*—Melissa J Koval
*Assistant Examiner*—Tiffany A Fetzner
(74) *Attorney, Agent, or Firm*—Armstrong Teasdale LLP

(57) ABSTRACT

An MRI apparatus includes an imaging device that performs MR imaging in an SSFP pulse sequence in which a phase cycling method produces RF excitation, and a control device that causes the imaging device; to collect data regarding a plurality of frequency regions in k-space in the SSFP pulse sequence in a first phase series; to collect data regarding low frequency regions in k-space in the SSFP pulse sequence in a plurality of remaining phase series; to generate frequency data based on the collected data, substitute data into high and low frequency regions of the frequency data, reconstruct low space frequency images based on the low frequency regions to which substitute data is added, reconstruct high space frequency images based on the high frequency regions to which substitute data have been added and combine the low space frequency images and the high space frequency images multiplied by a scaling factor.

20 Claims, 10 Drawing Sheets

U.S. PATENT DOCUMENTS

2007/0241751 A1* 10/2007 Kholmovski et al. ........ 324/307
2008/0129298 A1* 6/2008 Vaughan et al. ............ 324/322
2008/0246474 A1* 10/2008 Lai ............................ 324/307
2009/0105582 A1* 4/2009 Dougherty et al. .......... 600/420

* cited by examiner

FIG. 6
(a) Phase 1
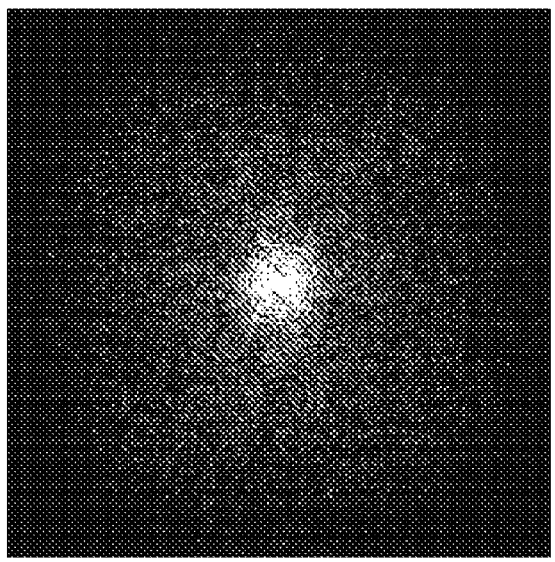
(b) Phase 2
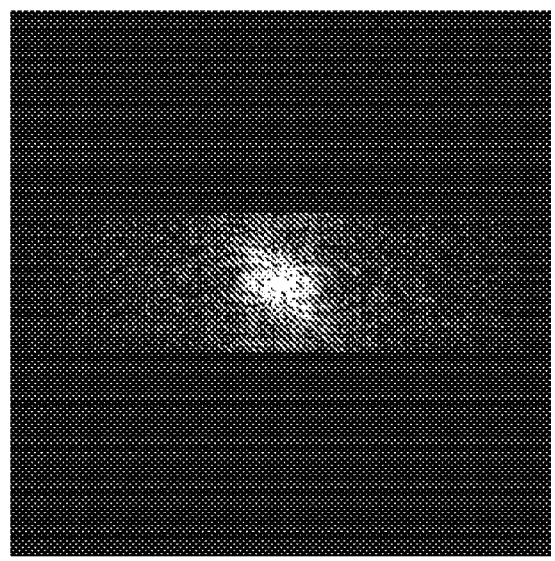
(c) Phase 3
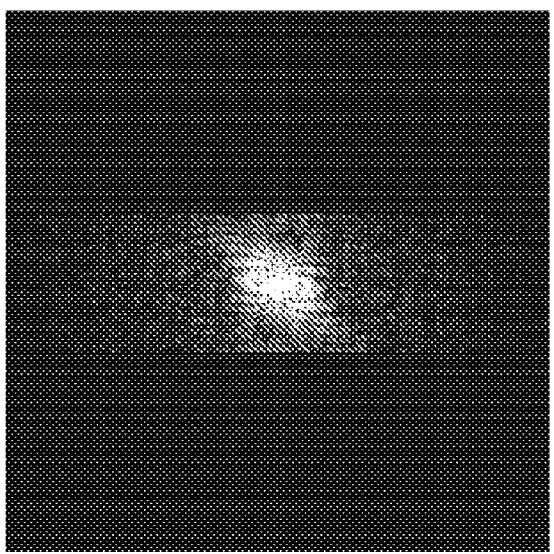
(d) Phase 4
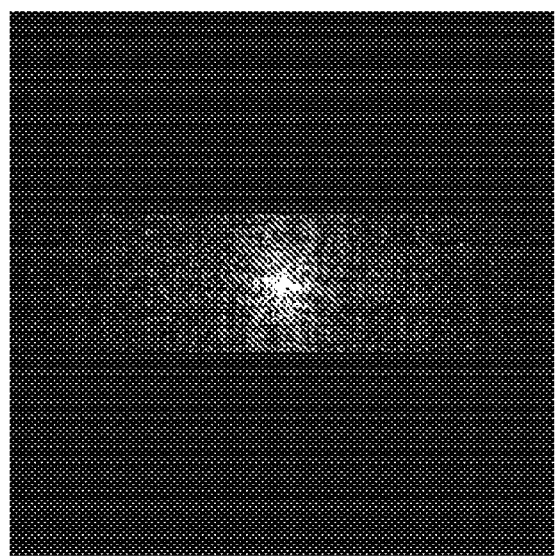

FIG. 7
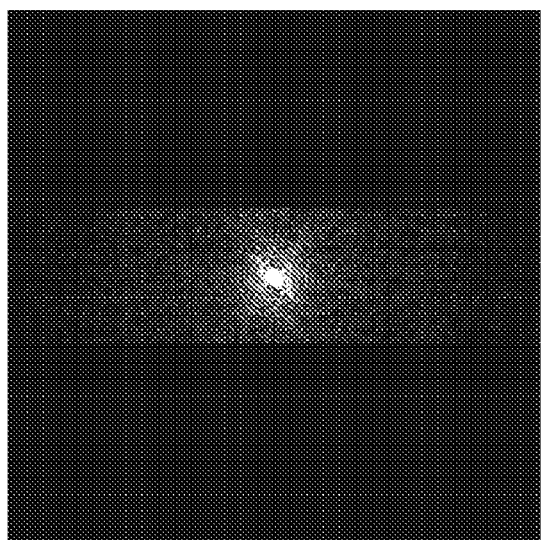
A
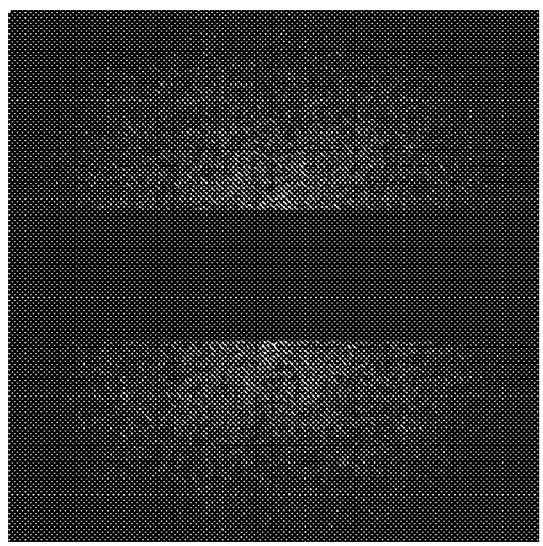
B

FIG. 8
(a)
A1
(b)
A2
(c)
A3
(d)
A4
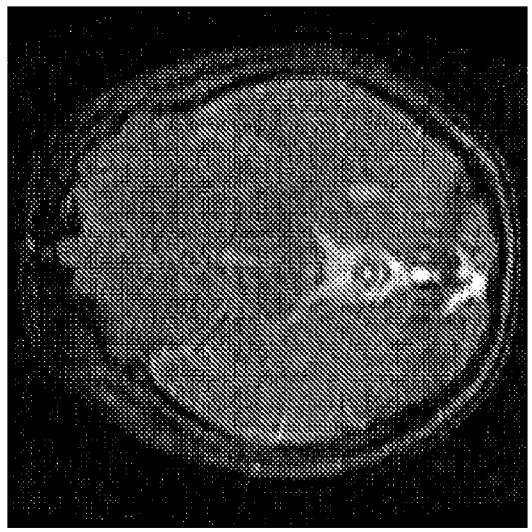

B1

A1+A2+A3+A4+B1 * scale

MRI APPARATUS AND CONTROL METHOD OF STEADY-STATE FREE PRECESSION (SSFP) WITH PHASE CYCLING, COMBINING LOW AND HIGH FREQUENCY IMAGES MULTIPLIED BY A SCALING FACTOR

CROSS REFERENCE TO RELATED APPLICATIONS

This application claims the benefit of Chinese Patent Application No. 200710137976.3 filed Apr. 6, 2007, which is hereby incorporated by reference in its entirety.

BACKGROUND OF THE INVENTION

The subject matter disclosed herein relates to an MRI (Magnetic Resonance Imaging) apparatus and a control method therefor, and more particularly to an MRI apparatus which performs MR imaging in an SSFP (Steady State Free Precession) pulse sequence in which RF (radio frequency) excitation is accomplished by a phase cycling method and a control method therefor.

As one of the methods for performing MR imaging of a subject with an MRI apparatus, there is an imaging method using an SSFP pulse sequence in which RF excitation is accomplished by a phase cycling method. By this method, the SSFP pulse sequence is executed while varying the phase of RF excitation by a prescribed step per TR (repetition time). A plurality of series of phase steps are made available, and the step series is changed over from one to another every round of data collection, namely at every Nex (number of exposure). And an image is reconstructed from collected in each round, and images free from band artifacts are obtained by subjecting the images to total addition, averaging, MIP (maximum intensity projection), RMS (root mean square) and the like (see, for example, U.S. Patent Publication No. 2006/0088083).

The imaging method described above, since it requires repetition of data collection often as the number of phase step series, takes a long time to accomplish imaging.

It is desirable that a problem described previously is solved.

In a first aspect, the invention provides an MRI apparatus having an imaging device which performs MR imaging in an SSFP pulse sequence in which RF excitation is accomplished by a phase cycling method and a control device which controls it, the MRI apparatus being characterized in that the control device causes the imaging device to collect data regarding all the frequency regions in a k-space in an SSFP pulse sequence in a first phase series out of a plurality of phase series; to collect data regarding low frequency regions in the k-space in the SSFP pulse sequence in the remaining phase series out of the plurality of phase series; to reconstruct an image by Fourier transform of the data regarding all the frequency regions collected in the SSFP pulse sequence in the first phase series; to generate frequency data of the k-space by inverse Fourier transform of the image; to separate the frequency data into data of the low frequency regions in the k-space and data of high frequency regions; to add data whose value is 0 to the separated data of the low frequency regions as substitute for the data of the high frequency regions; to add data whose value is 0 to the separated data of the high frequency regions as substitute for the data of the low frequency regions; to add data whose value is 0 to the data of the low frequency regions collected in the SSFP pulse sequence in the remaining phase series as substitute for the data of the high frequency regions; to reconstruct low space frequency images based on the low frequency regions to which the substitute data have been added; to reconstruct high space frequency images based on the high frequency regions to which the substitute data have been added; and to totally add the low space frequency images and the high space frequency images multiplied by a scaling factor.

In a second aspect, the invention provides a version of the MRI apparatus according to the first aspect, characterized in that the scaling factor is the ratio between the sum of a plurality of factors, figured out for each of a plurality of images reconstructed as the root-mean square of pixel values on the basis of the data of the low frequency regions to which the substitute data have been added, and one factor out of those factors.

In a third aspect, the invention provides a version of the MRI apparatus according to the second aspect, characterized in that the one factor has been figured out of an image which, out of the plurality of images, derives from data collected in the SSFP pulse sequence in the first phase series.

In a fourth aspect, the invention provides a version of the MRI apparatus according to the first aspect, characterized in that in the low frequency regions, the matrix size in the central part, of the k-space having a matrix size of 256×256, is 64×256.

In a fifth aspect, the invention provides a version of the MRI apparatus according to the first aspect, characterized in that the plurality of phase series are four phase series.

In a sixth aspect, the invention provides a method for controlling an MRI apparatus which performs MR imaging in an SSFP pulse sequence in which RF excitation is accomplished by a phase cycling method, the MRI apparatus control method being characterized in that the MRI apparatus is caused to collect data regarding all the frequency regions in a k-space in an SSFP pulse sequence in a first phase series out of a plurality of phase series; to collect data regarding low frequency regions in the k-space in the SSFP pulse sequence in the remaining phase series out of the plurality of phase series; to reconstruct an image by Fourier transform of the data regarding all the frequency regions collected in the SSFP pulse sequence in the first phase series; to generate frequency data of the k-space by inverse Fourier transform of the image; to separate the frequency data into data of the low frequency regions in the k-space and data of high frequency regions; to add data whose value is 0 to the separated data of the low frequency regions as substitute for the data of the high frequency regions; to add data whose value is 0 to the separated data of the high frequency regions as substitute for the data of the low frequency regions; to add data whose value is 0 to the data of the low frequency regions collected in the SSFP pulse sequence in the remaining phase series as substitute for the data of the high frequency regions; to reconstruct low space frequency images based on the low frequency regions to which the substitute data have been added; to reconstruct high space frequency images based on the high frequency regions to which the substitute data have been added; and to totally add the low space frequency images and the high space frequency images multiplied by a scaling factor.

In a seventh aspect, the invention provides a version of the MRI apparatus control method according to the sixth aspect, characterized in that the scaling factor is the ratio between the sum of a plurality of factors, figured out for each of a plurality of images reconstructed as the root-mean square of pixel values on the basis of the data of the low frequency regions to which the substitute data have been added, and one factor out of those factors.

In an eighth aspect, the invention provides a version of the MRI apparatus control method according to the seventh aspect, characterized in that the one factor has been figured out of an image which, out of the plurality of images, derives from data collected in the SSFP pulse sequence in the first phase series.

In a ninth aspect, the invention provides a version of the MRI apparatus control method according to the sixth aspect, characterized in that, in the low frequency regions, the matrix size in the central part, of the k-space having a matrix size of 256×256, is 64×256.

In a 10th aspect, the invention provides a version of the MRI apparatus control method according to the sixth aspect, characterized in that the plurality of phase series are four phase series.

According to the invention, it is possible to realize an MRI apparatus that permits imaging in a short length of time though using an SSFP pulse sequence in which RF excitation is accomplished by a phase cycling method.

Also, by the MRI apparatus control method according to the invention, it is possible to realize an MRI apparatus control method which permits imaging in a short length of time though using an SSFP pulse sequence in which RF excitation is accomplished by a phase cycling method.

As the scaling factor is the ratio between the sum of a plurality of factors, figured out for each of a plurality of images reconstructed as the root-mean square of pixel values on the basis of the data of the low frequency regions to which the substitute data have been added, and one factor out of those factors, the scaling factor can be made appropriate.

Since the one factor has been figured out of an image which, out of the plurality of images, derives from data collected in the SSFP pulse sequence in the first phase series, the scaling factor can be made appropriate.

In the low frequency regions, since the matrix size in the central part, of the k-space having a matrix size of 256×256, is 64×256, the low frequency regions can be made appropriate.

Since the plurality of phase series are four phase series, high quality images free from band artifacts can be obtained.

Further objects and advantages of the present invention will be apparent from the following description of the preferred embodiments of the invention as illustrated in the accompanying drawings.

BRIEF DESCRIPTION OF THE DRAWINGS

FIGS. 6(*a*)-6(*d*) are halftone views showing examples of data in the k-space.

FIGS. 7(*a*) and 7(*b*) are halftone views showing examples of data in the k-space.

FIGS. 8(*a*)-8(*d*) are halftone views showing examples of reconstructed images in a portion where the space frequency is low.

DETAILED DESCRIPTION OF THE INVENTION

Figure 1:
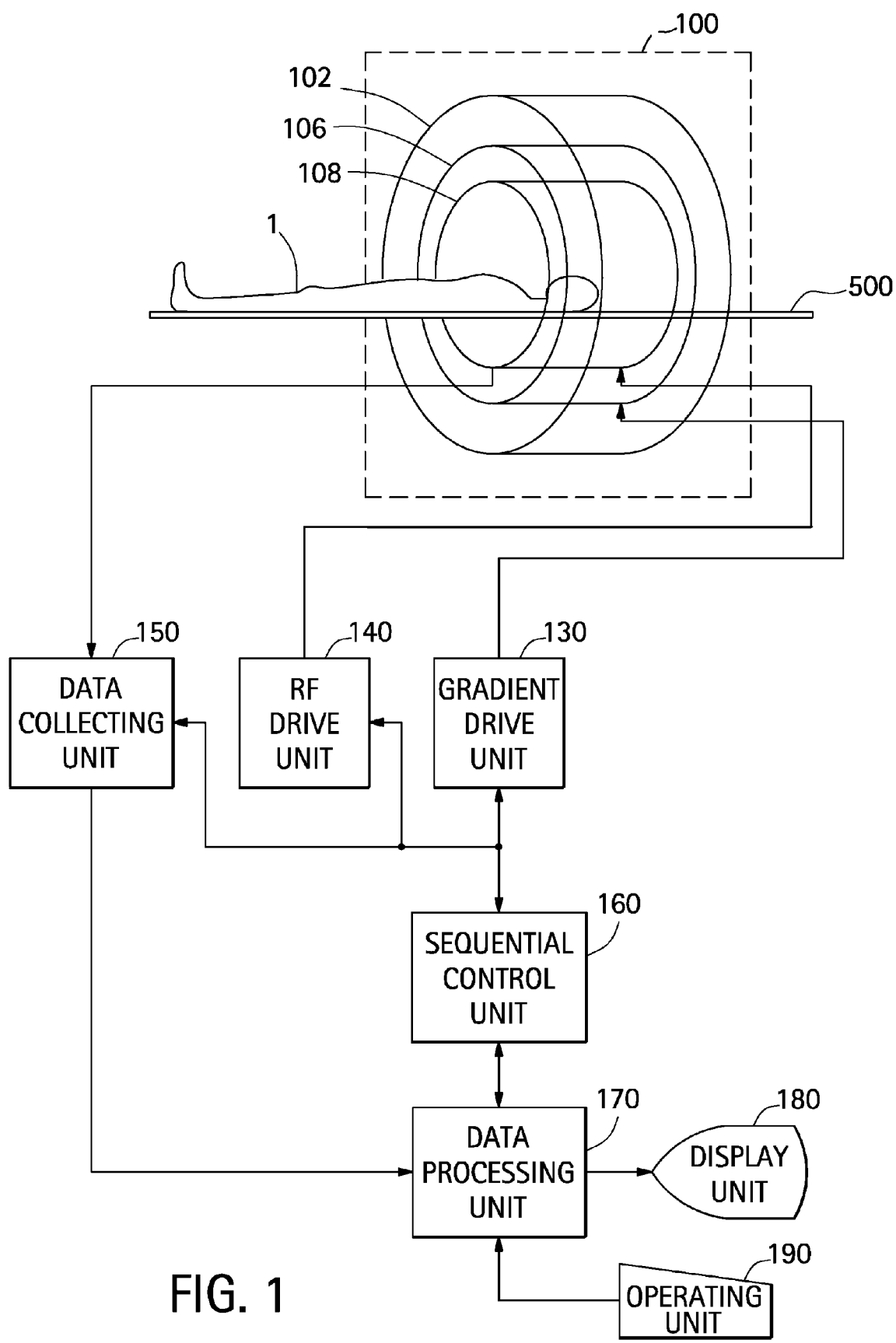
FIG. 1 is a block diagram of an MRI apparatus in one mode of carrying out the invention.

The best mode for carrying out the invention will be described in detail with reference to drawings. Incidentally, the invention is not limited to this best mode for carrying out the invention. A block diagram of an MRI apparatus is shown in FIG. 1. This apparatus is one example of the best mode for carrying out the invention. The configuration of this apparatus illustrates the best mode for carrying out the invention that relates to an MRI apparatus. The operation of this apparatus illustrates the best mode for carrying out the invention that relates to an MRI apparatus control method.

As shown in FIG. 1, this apparatus has a magnet system 100. The magnet system 100 has a main magnetic field coil unit 102, a gradient coil unit 106 and an RF coil unit 108. These coil units have substantially cylindrical shapes, and are arranged coaxially to one another. A subject 1, mounted on a cradle 500, is carried in and out by carriage means not shown into the substantially columnar internal space of the magnet system 100.

The main magnetic field coil unit 102 forms a magnetostatic field in the internal space of the magnet system 100. The direction of the magnetostatic field is substantially parallel to the body axis direction of the subject 1. Thus, a so-called horizontal magnetic field is formed. The main magnetic field coil unit 102 is configured of, for instance, a superconducting coil. Incidentally, it is not limited to a superconducting coil, but may be configured of a normal conducting coil or the like.

The gradient coil unit 106 generates three gradient magnetic fields for providing a gradient to the magnetostatic field intensity of each of three mutually perpendicular three axes, namely a slice axis, a phase axis and a frequency axis.

The mutually perpendicular three axes in the magnetostatic field being represented by X, Y and Z, any of them can be made the slice axis. In this case, one of the remaining two axes is made the phase axis and the other, the frequency axis. It is also possible to give the slice axis, the phase axis and the frequency axis any desired inclinations with respect to the X, Y and Z axes while maintaining the mutual perpendicularity. In this apparatus, the direction of the body axis of the subject 1 shall be the Z axis direction.

The gradient magnetic field in the slice axis direction is also called the slice gradient magnetic field. The gradient magnetic field in the phase axis direction is also called the phase encode magnetic field. The gradient magnetic field in the frequency axis direction is also called the read out gradient magnetic field. The read out gradient magnetic field is synonymous with the phase encode magnetic field. To make possible the generation of such gradient magnetic fields, the gradient coil unit 106 has three lines of gradient coils not shown. Hereinafter, the gradient magnetic fields may also be referred to as simply gradients.

The RF coil unit 108 forms a high frequency magnetic field for exciting spins within the body of the subject 1. Hereinafter, the formation of a high frequency magnetic field may also be referred to as the transmission of RF exciting signals. Furthermore, the RF exciting signal may also be referred to as an RF pulse. The electromagnetic wave that gives rise to excited spins, namely magnetic resonance signals, is received by the RF coil unit 108.

Magnetic resonance signals become signals in the frequency domain, namely signals in the Fourier space. Since magnetic resonance signals are encoded on two axes by the gradients in the phase axis direction and the frequency axis direction, the magnetic resonance signals are obtained as signals in the two-dimensional Fourier space. The phase encode magnetic gradient and the read out gradient determine the sampling positions of the signals in the two-dimensional Fourier space. Hereinafter the two-dimensional Fourier space will also be referred to as the k-space.

A gradient drive unit 130 is connected to the gradient coil unit 106. The gradient drive unit 130 provides a drive signal to the gradient coil unit 106 to have a gradient magnetic field generated. The gradient drive unit 130 has three lines of drive circuits not shown matching the three lines gradient coils in the gradient coil unit 106.

An RF drive unit 140 is connected to the RF coil unit 108. The RF drive unit 140 provides a drive signal to the RF coil unit 108 to have an RF pulse transmitted thereby to excite spins in the body of the subject 1.

A data collecting unit 150 is connected to the RF coil unit 108. The data collecting unit 150 collects as digital data receive signals received by the RF coil unit 108.

A sequential control unit 160 is connected to the gradient drive unit 130, the RF drive unit 140 and the data collecting unit 150. The sequential control unit 160 controls the gradient drive unit 130 or the data collecting unit 150 to accomplish collection of magnetic resonance signals.

The sequential control unit 160 is configured of a computer or the like for instance. The sequential control unit 160 has a memory not shown. The memory stores programs for the sequential control unit 160 and various data. The functions of the sequential control unit 160 are realized by the execution of programs stored in the memory by the computer.

The output side of the data collecting unit 150 is connected to a data processing unit 170. Data collected by the data collecting unit 150 are inputted to the data processing unit 170. The data processing unit 170 is configured of a computer or the like for instance. The data processing unit 170 has a memory not shown. The memory stores programs for the data processing unit 170 and various data.

The data processing unit 170 is connected to the sequential control unit 160. The data processing unit 170 is superior to and regulates the sequential control unit 160. The functions of this apparatus are realized by the execution of programs stored in the memory by the data processing unit 170.

The data processing unit 170 stores data collected by the data collecting unit 150 into the memory. A data space is formed in the memory. This data space matches the k-space. The data processing unit 170 reconstructs an image by subjecting data in the k-space into two-dimensional inverse Fourier transform. Incidentally, the forward and inverse directions of Fourier transform are not absolute but merely relative.

A display unit 180 and an operating unit 190 are connected to the data processing unit 170. The display unit 180 is configured of a graphic display or the like. The operating unit 190 is configured of a keyboard or the like provided with a pointing device.

The display unit 180 displays a reconstructed image outputted from the data processing unit 170 and various items of information. The operating unit 190 is operated by the user, and inputs various instructions, information and the like to the data processing unit 170. The user can operate this apparatus interactively through the display unit 180 and the operating unit 190.

Figure 2:
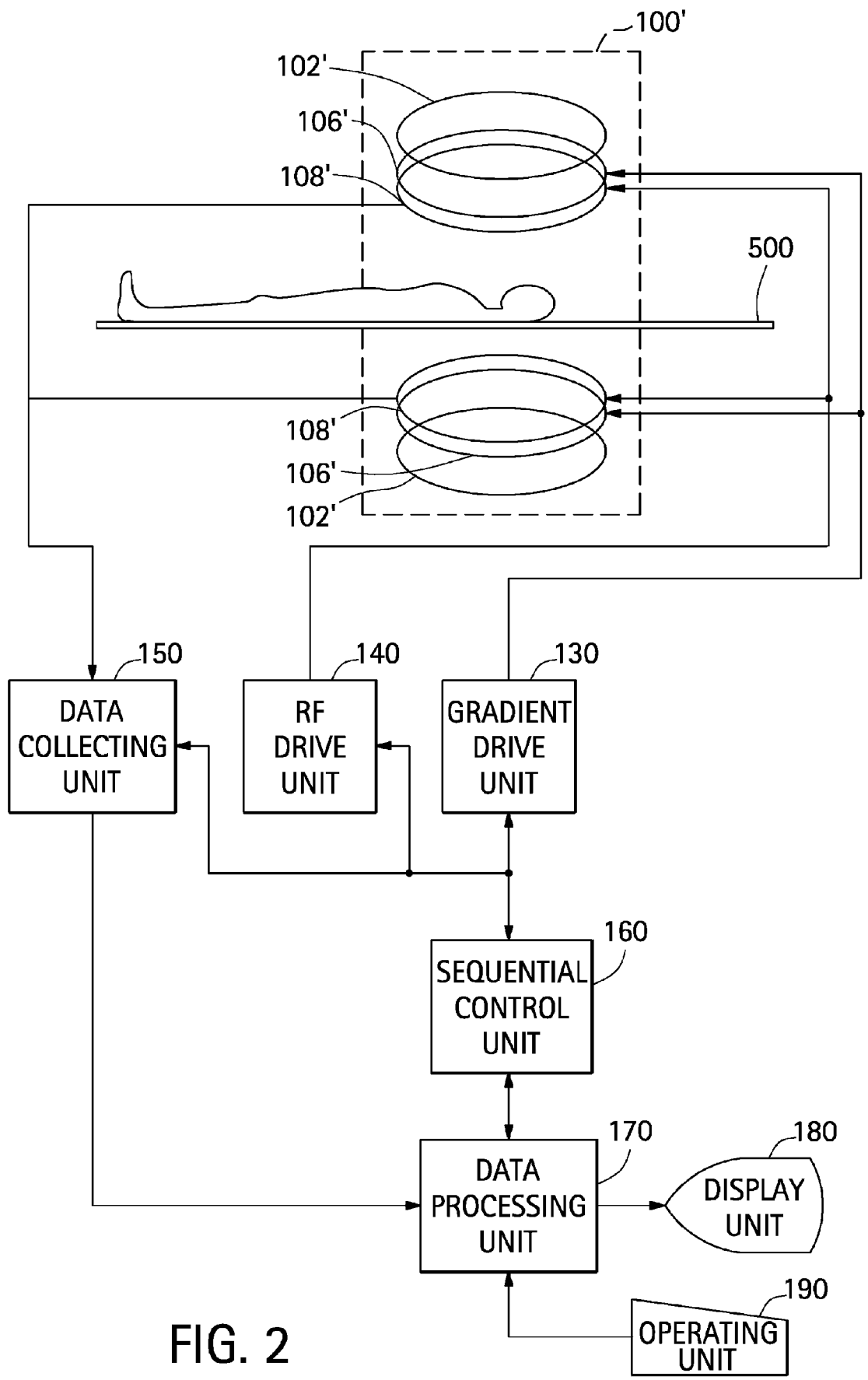
FIG. 2 is a block diagram of an MRI apparatus in one mode of carrying out the invention.

FIG. 2 shows a block diagram of a magnetic resonance imaging apparatus in another mode. The magnetic resonance imaging apparatus shown in FIG. 2 is one example of mode for carrying out the invention. The configuration of this apparatus represents one example of mode for implementation regarding the apparatus according to the invention.

This apparatus has a magnet system 100' different in formula from the apparatus shown in FIG. 1. In other respects than the magnet system 100', it has a similar configuration to the apparatus shown in FIG. 1, and similar parts will be assigned respectively the same reference signs, with their description dispensed with.

The magnet system 100' has main magnetic field coil units 102', gradient coil units 106' and RF coil units 108'. These main magnetic field coil units 102' and other coil units are paired, one unit of each pair opposite the other with a space in-between. All of them are substantially disk-shaped, arranged to share the center axis. A subject 1, mounted on a cradle 500, is carried in and out by carriage means not shown into the substantially columnar internal space of the magnet system 100'.

The main magnetic field coil units 102' form a magnetostatic field in the internal space of the magnet system 100'. The direction of the magnetostatic field is substantially orthogonal to the direction of the body axis of the subject 1. Thus there is formed a so-called vertical magnetic field. The main magnetic field coil units 102' are configured of permanent magnets or the like for instance. Incidentally, the material is not limited to permanent magnets, but the units many be configured of superconducting electromagnets, normal conducting electromagnets or the like.

The gradient coil units 106' generate three gradient magnetic fields for providing a gradient to the magnetostatic field intensity of each of three mutually perpendicular three axes, namely a slice axis, a phase axis and a frequency axis.

The mutually perpendicular three axes in the magnetostatic field being represented by X, Y and Z, any of them can be made the slice axis. In this case, one of the remaining two axes is made the phase axis and the other, the frequency axis. It is also possible to give the slice axis, the phase axis and the frequency axis any desired inclinations with respect to the X, Y and Z axes while maintaining the mutual perpendicularity. In this apparatus, too, the direction of the body axis of the subject 1 shall be the Z axis direction. To make possible generation of such a magnetostatic field, the gradient coil units 106' have three lines of gradient coils not shown.

The RF coil unit 108' transmits to the magentstatic field space an RF pulse for exciting spins within the body of the subject 1. The electromagnetic wave which gives rise to excited spins, namely, magnetic resonance signals, is received by the RF coil unit 108'. The receive signals of the RF coil unit 108' are inputted to the data collecting unit 150.

Figure 3:
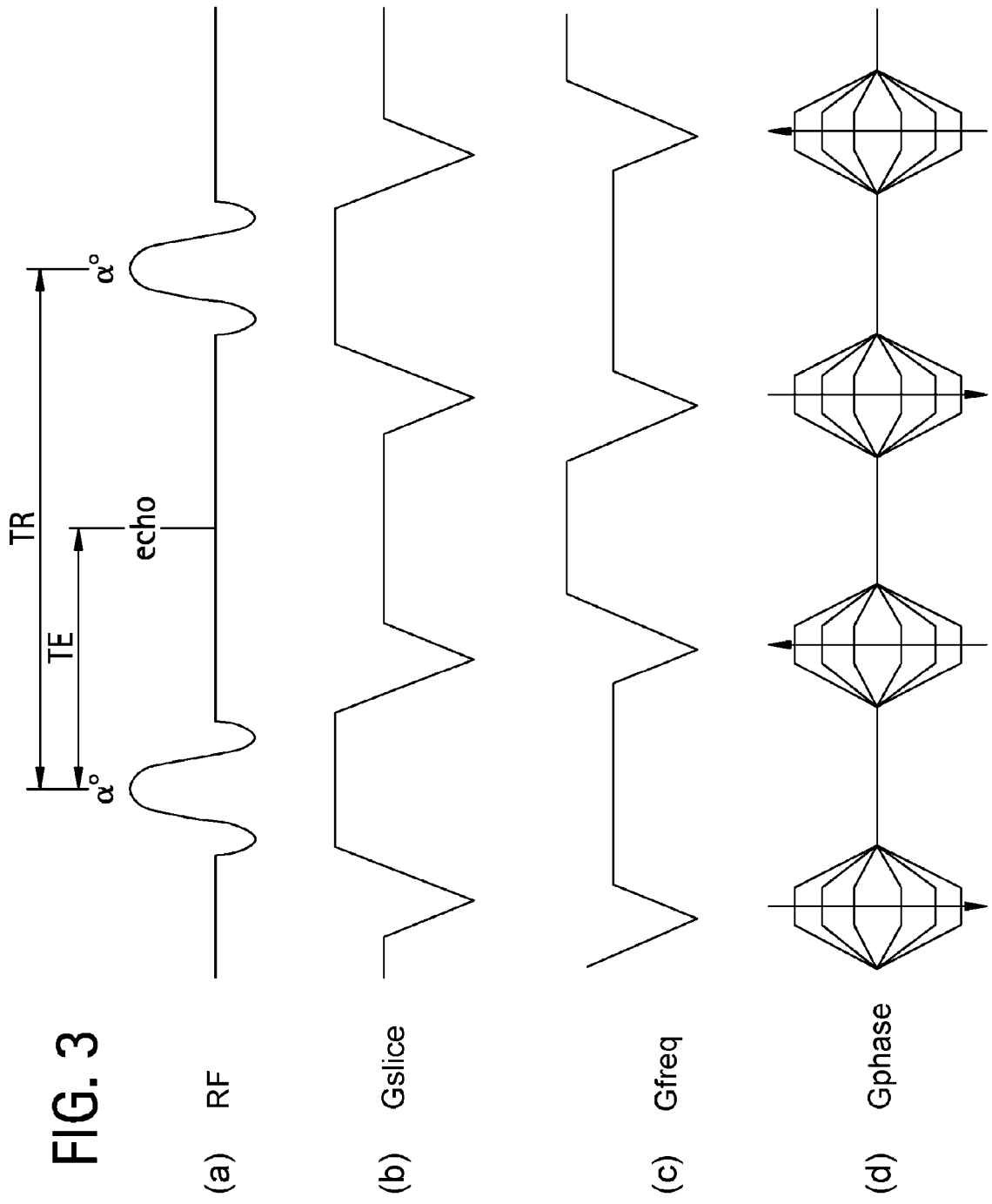
FIGS. 3(*a*)-3(*d*) are diagrams charting the SSFP pulse sequences executed by the MRI apparatus in one mode of carrying out the invention.

FIGS. 3(*a*)-3(*d*) show SSFP pulse sequences. These pulse sequences may also be called FIESTA (Fast Imaging employing Steady State Acquisition) or FISP (Fast Imaging with Steady State precession).

The pulse sequence proceeds from left to right. FIG. 3(*a*) shows the pulse sequence of RF signals. FIGS. 3(*b*)-3(*d*) show the pulse sequences of a gradient magnetic field. FIG. 3(*b*) is a slice gradient, FIG. 3(*c*) is a frequency encode gradient and FIG. 3(*d*) is a phase encode gradient. Incidentally, the magnetostatic field is always applied at a fixed magnetic field intensity.

As shown in FIGS. 3(*a*)-3(*d*), spins are excited with an $\alpha°$ pulse. The spin excitation is a selective excitation under a slice gradient Gslice. The spin excitation is repeated in a period TR. The period TR is also called a pulse repeat time. Hereinafter the pulse repeat time may be referred to as simply TR. 1 TR corresponds to 1 view.

An echo is read out with a frequency encode gradient Gfreq applied during 1 TR. Incidentally, an echo is represented by its center signal. The length of time from the center of the $\alpha°$ pulse to the echo center is the echo time TE. Hereinafter the echo time may be referred to as simply TE. Usually, the frequency encode gradient Gfreq is so set as to make TE=TR/2 hold.

During 1 TR, the phase encode gradient Gphase is applied immediately after the excitation of a spin and immediately before the excitation of the next. These paired phase encode gradients Gphase are symmetrical in magnitude and polarity. This causes the leading phase encode gradient Gphase to wind up the phase encode and the trailing phase encode gradient Gphase to wind back the phase encode. The quantity of the phase encode is altered in every TR. By having the phase encode and the frequency encode read out an echo, data in the k-space are sampled.

Figure 4:
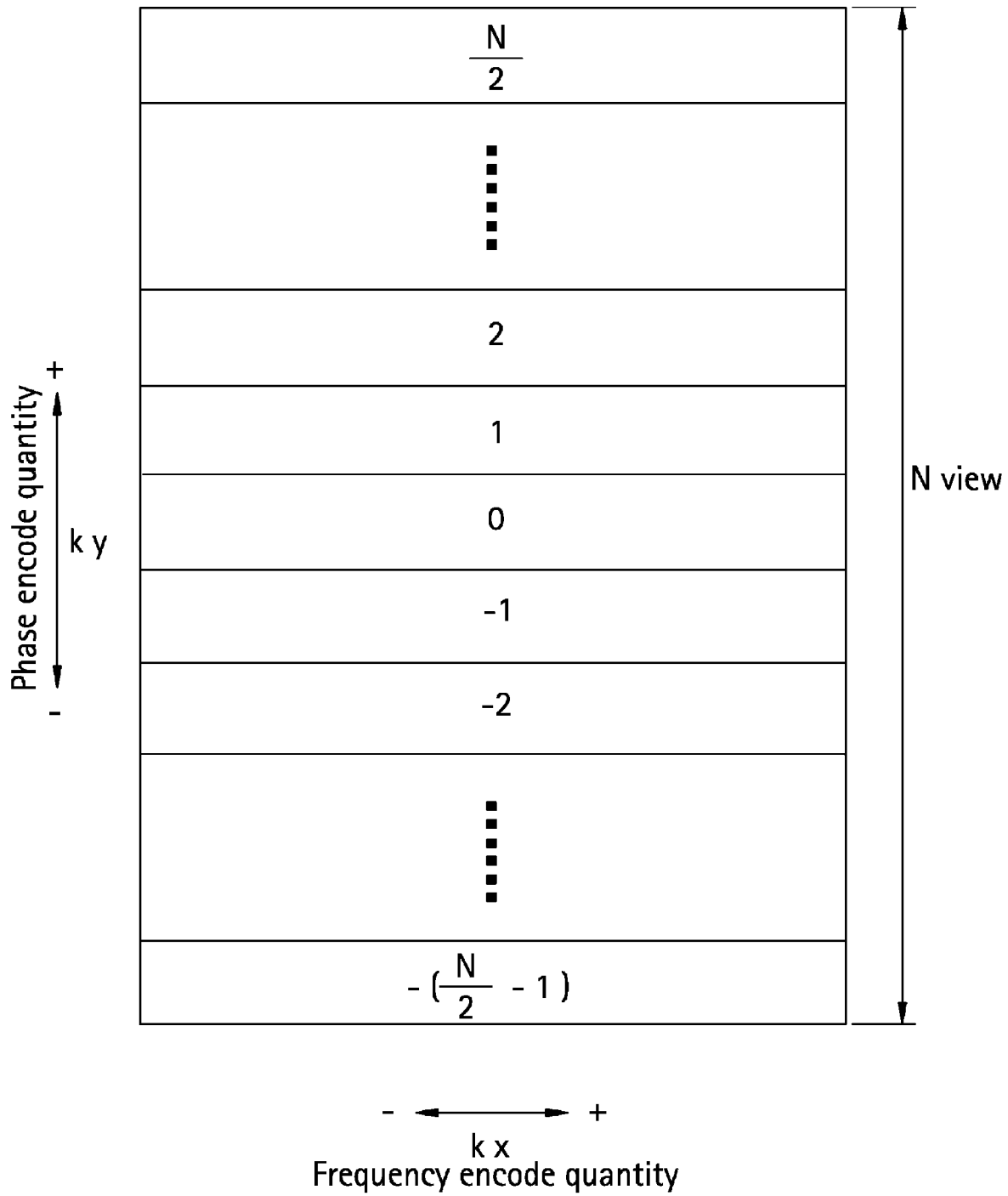
FIG. 4 is a diagram showing the k-space.

FIG. 4 shows a conceptual diagram of the k-space. As shown in FIG. 4, the horizontal axis kx of the k-space is the frequency axis and the vertical axis ky, the phase axis. In FIG. 4, each of a plurality of transversely longer rectangles represents a data sampling position. The numeral stated in each rectangle represents the phase encode quantity. The phase encode quantity is normalized at π/N. N is the number of samples in the phase direction. The number of samples in the phase direction may also be referred to as the number of views.

The phase encode is 0 at the center of the phase axis ky. The phase encode quantity gradually increases from the center toward both ends. The polarities of the increase are reverse to each other. The sampling intervals, namely the steps of the phase encode quantity are π/N. The region smaller in phase encode quantity is the low frequency. The region greater in phase encode quantity is the high frequency region.

This apparatus carries out such data collection in accordance with a phase cycling method. Namely, it does so while altering the phase of the α° pulse by a prescribed step at every TR. The phase steps are made available in a plurality of series and switched over at every repetition of data collection, namely at every Nex (number of exposures).

In this document, the series of phase steps will be referred to as phase series. Four phase series are made available when, for instance, Nex is 4. And the first phase series is used for the first round of data collection, the second phase series is used for the second round of data collection, the third phase series is used for the third round of data collection, and the fourth phase series is used for the fourth round of data collection.

The phase step of the first phase series is 180° for instance, the phase step of the second phase series is 72° for instance, the phase step of the third phase series is 144° for instance, and the phase step of the fourth phase series is 215° for instance.

Hereinafter, the first phase series may also be referred to as Phase 1, the second phase series as Phase 2, the third phase series as Phase 3, and the fourth phase series as Phase 4.

Figure 5:
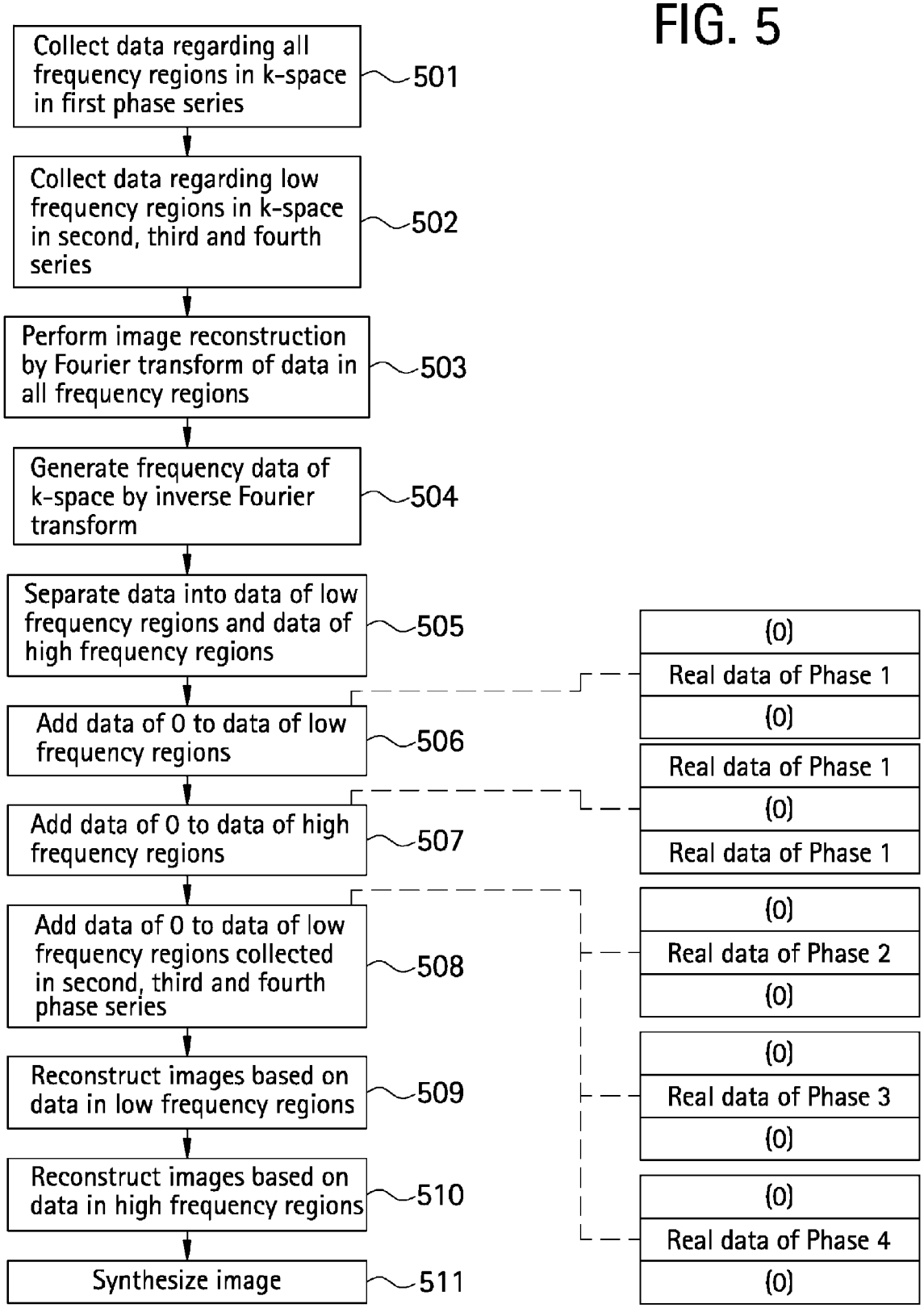
FIG. 5 is a flow chart of the operation of this apparatus.

FIG. 5 shows a flow chart of the operation of this apparatus. This operation is accomplished under the control of the data processing unit 170. Out of the various functions of the data processing unit 170, what pertains to control is one example of a control device in the invention. Every part of this apparatus controlled thereby is one example of an imaging device in the invention.

As shown in FIG. 5, data are collected regarding all the frequency regions in the k-space in the first phase series at Step 501. When the matrix size of the k-space is 256×256 for instance, the matrix size of all the frequency regions is 256×256. This makes the number of views required for data collection from these regions 256, and the time taken for data collection is 256 TR.

At Step 502, data are collected regarding the low frequency regions in the k-space in the second, third and fourth phase series. The matrix size for the low frequency regions is set to 64×256 for instance. This makes the number of views required for data collection from these regions 64, and the time taken for data collection is 64 TR. Thus, the time taken for data collection is reduced to ¼ of that taken for collection in the first phase series.

FIGS. 6(a)-6(d) are halftone views of examples of data in the k-space, collected in the first, second, third and fourth phase series.

At Step 503, image reconstruction is carried out by Fourier transform of data in all the frequency regions. The data in all the frequency regions are data collected in the first phase series.

At Step 504, frequency data of the k-space are generated by inverse Fourier transform of the reconstructed image. The matrix size of these frequency data is 256×256.

At Step 505, the frequency data are separated into data of the low frequency regions in the k-space and data of high frequency regions. The matrix size of the low frequency regions is 64×256. The matrix size of the high frequency regions is 192×256.

Data A of the low frequency regions and Data B of the high frequency regions are shown in halftone views in FIGS. 7(a) and 7(b), respectively.

At Step 506, data of 0 in value are added to the separated data of the low frequency regions as substitute for the data of the high frequency regions.

At Step 507, data of 0 in value are added to the separated data of the high frequency regions as substitute for the data of the low frequency regions.

At Step 508, data of 0 in value are added to the data of the low frequency regions collected in the second, third and fourth phase series as substitute for the data of the high frequency regions.

At Step 509, images based on data in the low frequency regions to which data of 0 in value have been added are reconstructed. The reconstruction is carried out by Fourier transform. This provides images A1, A2, A3 and A4 respectively matching the first, second, third and fourth phase series. FIGS. 8(a)-8(d) are halftone views showing examples of images A1, A2, A3 and A4. All of them are images regarding portions where the space frequency is low.

Figure 9:
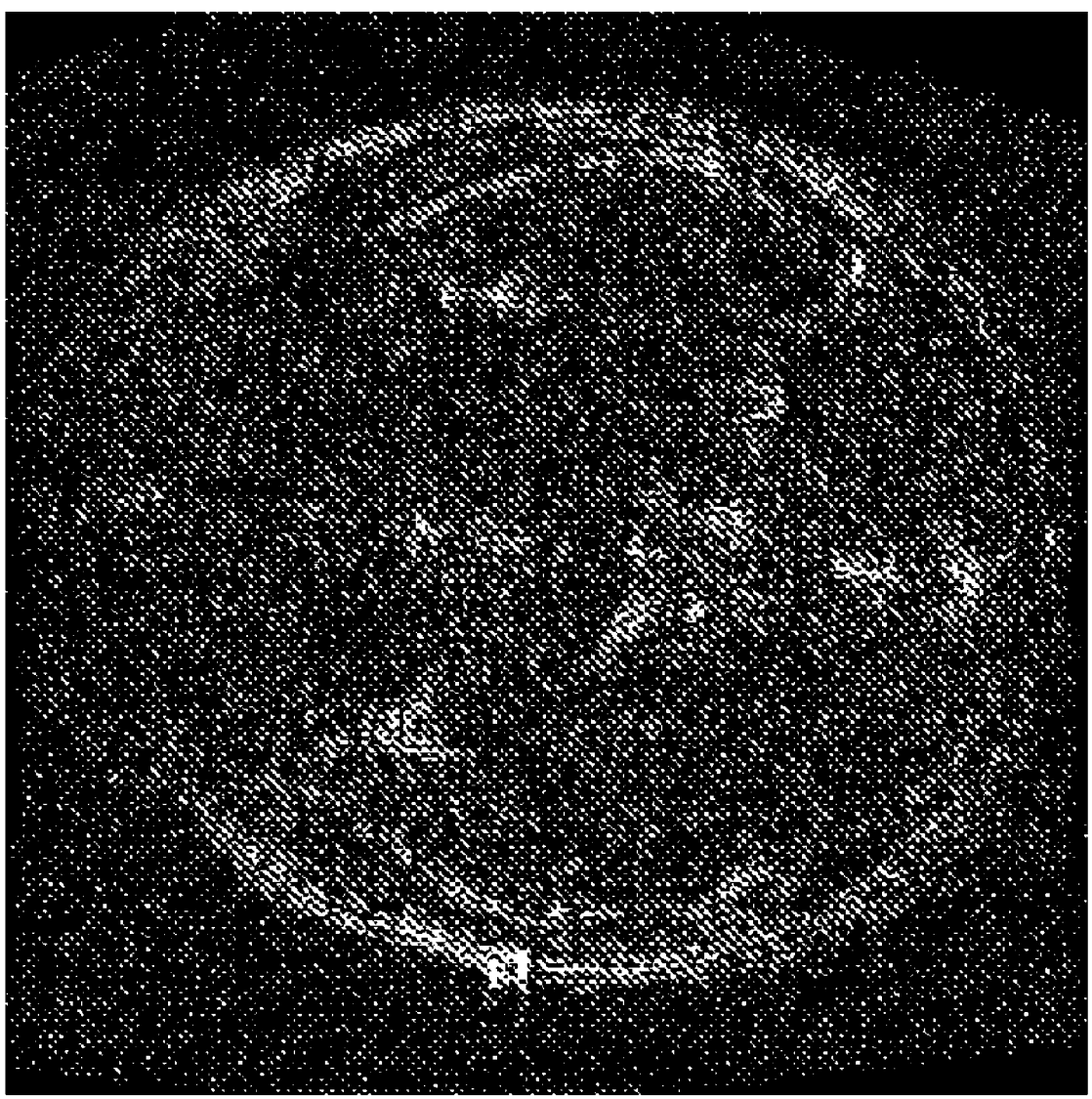
FIG. 9 is a halftone view showing an example of reconstructed image in a portion where the space frequency is high.

At Step 510, images based on data in the high frequency regions to which data of 0 in value have been added are reconstructed. The reconstruction is carried out by Fourier transform. This provides image B1. FIG. 9 shows a halftone view of the image B1. This is an image regarding a portion where the space frequency is high.

At Step 511, image synthesis is carried out. The image synthesis is accomplished according to the following formula.

$$\text{Combined image} = (A1 + A2 + A3 + A4) + B1 * \text{scale} \quad \text{(Eq. 1)}$$

As indicated by the foregoing formula, the image synthesis is accomplished by totaling the images A1, A2, A3 and A4 and the image B that is multiplied by a scaling factor.

The scaling factor is given by the following formula.

$$\text{Scale} = (Amp1 + Amp2 + Amp3 + Amp4)/Amp1 \quad \text{(Eq. 2)}$$

Where $$Amp1 = \text{sqrt}(\text{sum}(pixel1^2 + pixel2^2 \ldots)) \text{ (for the image A1)} \quad \text{(Eq. 3)}$$

$$Amp2 = \text{sqrt}(\text{sum}(pixel1^2 + pixel2^2 \ldots)) \text{ (for the image A2)} \quad \text{(Eq. 4)}$$

Amp3=sqrt(sum(pixel1^2+pixel2^2 ... )) (for the
image A3) (Eq. 5)

Amp4=sqrt(sum(pixel1^2+pixel2^2 ... )) (for the
image A4) (Eq. 6)

Thus the scaling factor is given as the ratio between the sum of a plurality of factors Amp1, Amp2, Amp3 and Amp4, each figured out as the root-mean square of pixel values for each of the images A1, A2, A3 and A4 and one of those factors, Amp1.

Figure 10:
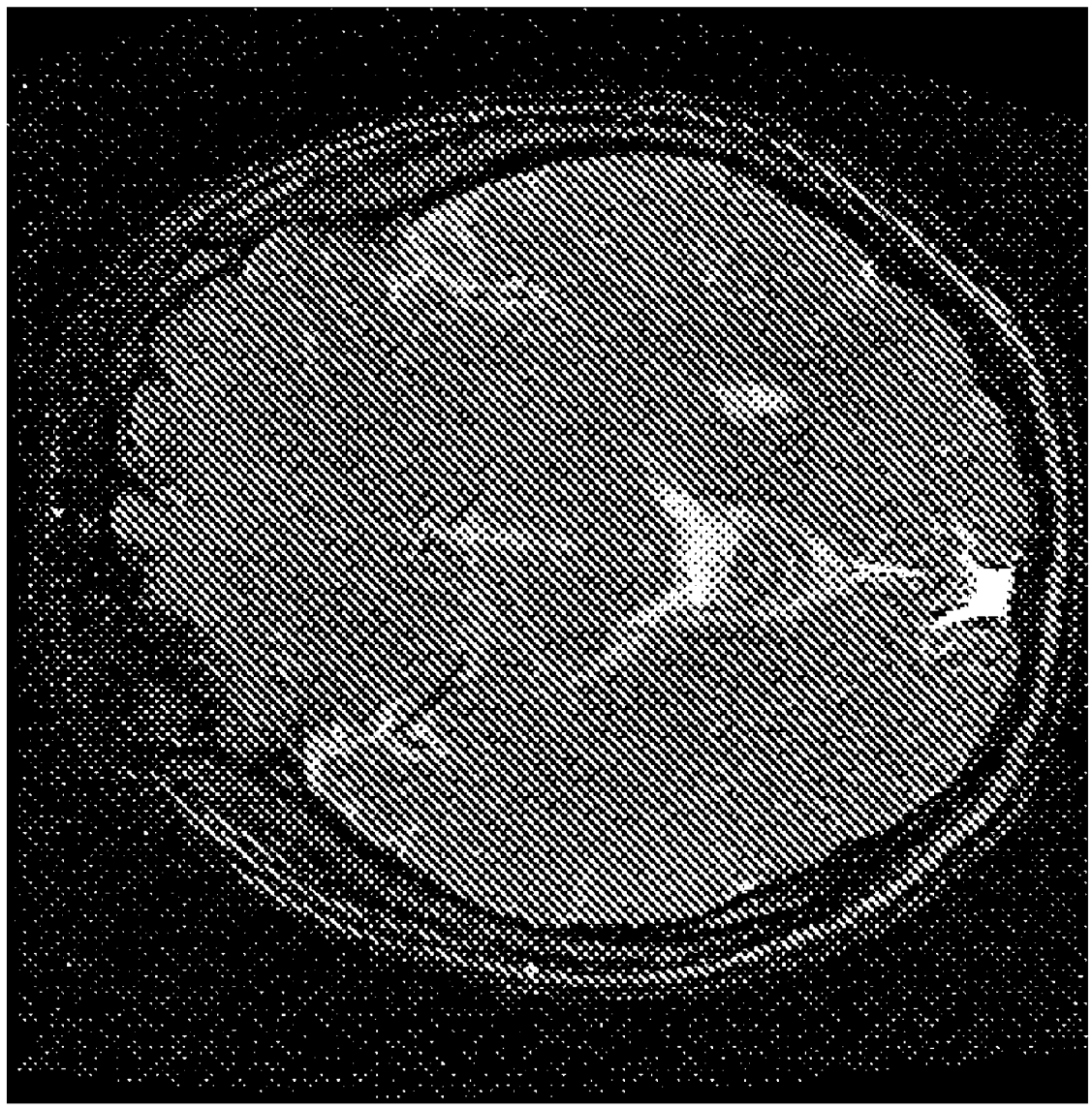
FIG. 10 is a halftone view showing an example of synthesized image.

FIG. 10 is a halftone view of an example of a synthesized image. The synthesized image is an image containing all the space frequency components. Further, since imaging is accomplished in accordance with the phase cycling method, the image is free from band artifacts.

As hitherto described, since this apparatus collects data regarding all the frequency regions of the k-space in the first phase series and only regarding the low frequency regions in other phase series, the required imaging time can be made substantially shorter than the conventional time length.

Also, where an imaging time about as long as the conventional length is tolerated, band artifacts can be further reduced by increasing the variety of phase series. Further, where an SN (signal-to-noise ratio) comparable to the conventional level is tolerated, a reduction in required imaging time and suppression of band artifacts can be achieved at the same time.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnetic resonance imaging (MRI) apparatus comprising:
   an imaging device configured to perform magnetic resonance imaging in a steady state free precession (SSFP) pulse sequence in which radio frequency (RF) excitation is accomplished by a phase cycling method; and
   a control device configured to control execution of the phase cycling method by said imaging and to cause said imaging device to:
      collect data regarding a plurality of frequency regions in a k-space in the SSFP pulse sequence in a first phase series of a plurality of phase series;
      collect data regarding low frequency regions in the k-space in the SSFP pulse sequence in the remaining phase series of the plurality of phase series;
      reconstruct an image by Fourier transform of the data regarding the plurality of frequency regions collected in the SSFP pulse sequence in the first phase series;
      generate frequency data of the k-space by inverse Fourier transform of the image;
      separate the frequency data into data of low frequency regions in the k-space and data of high frequency regions in the k-space;
      add data having a value equal to 0 to the separated data of the low frequency regions collected in the SSFP pulse sequence in the first phase series as first substitute data for the data of the high frequency regions;
      add data having a value equal to 0 to the separated data of the high frequency regions collected in the SSFP pulse sequence in the first phase series as second substitute data for the data of the low frequency regions;
      add data having a value equal to 0 to the data of the low frequency regions collected in the SSFP pulse sequence in the remaining phase series as third substitute data for the data of the high frequency regions;
      reconstruct a plurality of low space frequency images based on the low frequency regions to which the third substitute data have been added;
      reconstruct a plurality of high space frequency images based on the high frequency regions to which the second substitute data have been added; and
      combine the plurality of low space frequency images and the plurality of high space frequency images multiplied by a scaling factor.

2. The MRI apparatus according to claim 1, wherein the scaling factor is a ratio between a sum of a plurality of factors, the scaling factor determined for each of a plurality of images reconstructed as a root-mean square of pixel values based on the data of the low frequency regions to which the third substitute data have been added, and a first factor of the plurality of factors.

3. The MRI apparatus according to claim 2, wherein the first factor is determined for a first image of the plurality of images, using data collected in the SSFP pulse sequence in the first phase series.

4. The MRI apparatus according to claim 1, wherein the k-space has a matrix size of 256×256 such that a central portion of the k-space related to the low frequency regions has a size of 64×256.

5. The MRI apparatus according to claim 1, wherein the plurality of phase series are four phase series.

6. The MRI apparatus according to claim 1, wherein said imaging device is configured to produce a magnetostatic field that is substantially parallel to a body axis of a subject to be examined.

7. The MRI apparatus according to claim 1, wherein said imaging device is configured to produce a magnetostatic field that is substantially orthogonal to a body axis of a subject to be examined.

8. A method for controlling a magnetic resonance imaging (MRI) apparatus configured to perform magnetic resonance (MR) imaging using a steady state free precession (SSFP) pulse sequence in which radio frequency (RF) excitation is accomplished by a phase cycling method, said method for controlling comprising:
   collecting data regarding a plurality of frequency regions in a k-space in the SSFP pulse sequence in a first phase series of a plurality of phase series;
   collecting data regarding low frequency regions in the k-space in the SSFP pulse sequence in the remaining phase series of the plurality of phase series;
   reconstructing an image by Fourier transform of the data regarding the plurality of frequency regions collected in the SSFP pulse sequence in the first phase series;
   generating frequency data of the k-space by inverse Fourier transform of the image;
   separating the frequency data into data of low frequency regions in the k-space and data of high frequency regions in the k-space;
   adding data having a value equal to 0 to the separated data of the low frequency regions collected in the SSFP pulse sequence in the first phase series as first substitute data for the data of the high frequency regions;
   adding data having a value equal to 0 to the separated data of the high frequency regions collected in the SSFP pulse sequence in the first series as second substitute data for the data of the low frequency regions;
   adding data having a value equal to 0 to the data of the low frequency regions collected in the SSFP pulse sequence in the remaining phase series as third substitute data for the data of the high frequency regions;

reconstructing a plurality of low space frequency images based on the low frequency regions to which the third substitute data have been added;

reconstructing a plurality of high space frequency images based on the high frequency regions to which the second substitute data have been added; and combining the plurality of low space frequency images and the plurality of high space frequency images multiplied by a scaling factor.

9. The method for controlling an MRI apparatus according to claim 8, wherein separating the frequency data into data of low frequency regions and collect data regarding all the frequency regions in a k-space in an SSFP a steady state free precession (SSFP) pulse sequence in a first phase series of a plurality of phase series; and collect data regarding low frequency regions in the k-space in pulse sequence in the remaining phase series of the plurality of phase series; and a data processing unit configured to control said sequential control unit and said data collecting unit, said data processing unit further configured to:

reconstruct an image by Fourier transform of the data regarding the plurality of frequency regions collected in the SSFP pulse sequence in the first phase series;

generate frequency data of the k-space by inverse Fourier transform of the image;

separate the frequency data into data of low frequency regions in the k-space and data of high frequency regions in the k-space;

add data having a value equal to 0 to the separated data of the low frequency regions collected in the SSFP pulse sequence in the first phase series as first substitute data for the data of the high frequency regions;

add data having a value equal to 0 to the separated data of the high frequency regions collected in the SSFP pulse sequence in the first phase series as second substitute data for the data of the low frequency regions;

add data having a value equal to 0 to the data of the low frequency regions collected in the SSFP pulse sequence in the remaining phase series as third substitute data for the data of the high frequency regions;

reconstruct a plurality of low space frequency images based on the low frequency regions to which the third substitute data have been added;

data of the high frequency regions comprises separating the frequency data using a matrix size of 256×256 such that a central portion of the k-space related to the low frequency regions has a size of 64×256.

10. The method for controlling an MRI apparatus according to claim 8, wherein the plurality of phase series includes four phase series.

11. The method for controlling an MRI apparatus according to claim 8, wherein combining the plurality of low frequency images and the plurality of high frequency images multiplied by a scaling factor comprises determining the scaling factor based on a ratio between a sum of a plurality of factors, the scaling factor determined for each of a plurality of images reconstructed as a root-mean square of pixel values based on the data of the low frequency regions to which the third substitute data have been added, and a first factor of the plurality of factors.

12. The method for controlling an MRI apparatus according to claim 11, wherein determining the scaling factor comprises determining the first factor based on a first image of the plurality of images, using data collected in the SSFP pulse sequence in the first phase series.

13. The method for controlling an MRI apparatus according to claim 8, further comprising generating a magnetostatic field that is substantially parallel to a body axis of a subject to be examined.

14. The method for controlling an MRI apparatus according to claim 8, further comprising generating a magnetostatic field that is substantially orthogonal to a body axis of a subject to be examined.

15. A magnetic resonance imaging (MRI) apparatus comprising:

a magnet system configured to generate a magnetostatic field using a plurality of magnetic coils;

a sequential control unit configured to control said magnet system;

a data collecting unit configured to:

reconstruct a plurality of high space frequency images based on the high frequency regions to which the second substitute data have been added; and combine the plurality of low space frequency images and the plurality of high space frequency images multiplied by a scaling factor.

16. The MRI apparatus according to claim 15, wherein the scaling factor is a ratio between a sum of a plurality of factors, the scaling factor determined for each of a plurality of images reconstructed as a root-mean square of pixel values based on the data of the low frequency regions to which the third substitute data have been added, and a first factor of the plurality of factors.

17. The MRI apparatus according to claim 15, wherein the first factor is determined for a first image of the plurality of images, using data collected in the SSFP pulse sequence in the first phase series.

18. The MRI apparatus according to claim 15, wherein the k-space has a matrix size of 256×256 such that a central portion of the k-space related to the low frequency regions has a size of 64×256.

19. The MRI apparatus according to claim 15, wherein the plurality of phase series includes four phase series.

20. The MRI apparatus according to claim 15, wherein said magnet system is configured to generate the magnetostatic field one of substantially parallel to a body axis of a subject to be examined and substantially orthogonal to the body axis of the subject to be examined.

* * * * *